(12) United States Patent
Daniels et al.

(10) Patent No.: US 8,081,101 B2
(45) Date of Patent: Dec. 20, 2011

(54) ANALOG-TO-DIGITAL CONVERTER USING OSCILLATORS

(75) Inventors: Jorg Daniels, Leuven (BE); Wim Dehaene, Kessel-Lo (BE); Andreas Wiesbauer, Poertschach (AT); Michiel Steyaert, Leuven (BE)

(73) Assignee: Infineon Technologies AG, Neubiberg (DE)

( * ) Notice: Subject to any disclaimer, the term of this patent is extended or adjusted under 35 U.S.C. 154(b) by 13 days.

(21) Appl. No.: 12/701,549

(22) Filed: Feb. 6, 2010

(65) Prior Publication Data

US 2011/0193731 A1    Aug. 11, 2011

(51) Int. Cl.
*H03M 1/60* (2006.01)
(52) U.S. Cl. .......................... 341/157; 341/143; 341/155
(58) Field of Classification Search .................. 341/143, 341/144, 161, 157, 155
See application file for complete search history.

(56) References Cited

U.S. PATENT DOCUMENTS

| | | | | |
|---|---|---|---|---|
| 3,514,705 | A * | 5/1970 | Feigleson | 327/43 |
| 3,833,903 | A * | 9/1974 | Gordon et al. | 341/133 |
| 5,092,330 | A * | 3/1992 | Duggan | 600/300 |
| 6,111,533 | A * | 8/2000 | Yuan et al. | 341/157 |
| 6,784,822 | B1 * | 8/2004 | Nix et al. | 341/161 |
| 2004/0155805 | A1 * | 8/2004 | Preisach | 341/144 |
| 2008/0036633 | A1 * | 2/2008 | Moore et al. | 341/143 |
| 2008/0084247 | A1 * | 4/2008 | Sakai | 331/18 |

OTHER PUBLICATIONS

Daniels, J.; Dehaene, W.; Steyaert, M.; Wiesbauer, A., "A 350-MHz combined TDC-DTC With 61 ps resolution for asynchronous delta-sigma ADC applications," Solid State Circuits Conference, 2008. A-SSCC '0S. IEEE Asian, vol., no., pp. 365-368, Nov. 3-5, 2008.
Daniels, J.; Dehaene, W.; Steyaert, M.; Wiesbauer, A., "AID conversion using an Asynchronous Delta-Sigma Modulator and a time-to-digital converter," Circuits and Systems, 2008. ISCAS 2008. IEEE International Symposium on, vol., no., pp. 164S-1651, IS-May 21, 2008.
Daniels, J.; Dehaene, W.; Steyaert, M.; Wiesbauer, A., "A 350-MHz combined TDC-DTC With 61 ps resolution for asynchronous delta-sigma ADC applications," Solid State Circuits Conference, 2008. A-SSCC '0S. IEEE Asian, vol., no., pp. 365-368, Nov. 3-5, 200S.
Dhanasekaran, V.; Gambhir, M.; Elsayed, M.M.; Sanchez-Sinencio, E.; Silva Martinez, J.; Mishra, C.; Lei Chen; Pankratz, E., "A 20MHz BW 6SdB DR CT delta-sigma ADC based on a multi-bit time-domain quantizer and feedback element," Solid-State Circuits Conference—Digest of Technical Papers, 2009. ISSCC 2009. IEEE International, vol., no., pp. 174-175,175a, Feb. 8-12, 2009.
Naraghi, S.; Courcy, M.; Flynn, M.P., "A 9b 14microW 0.06mm2 PPM ADC in 90nm digital CMOS," Solid-State Circuits Conference—Digest of Technical Papers, 2009. ISSCC 2009. IEEE International, vol., no., pp. 168-169,169a, Feb. 8-12, 2009.
Park, M.; Perrott, M., "A O.13micro-m CMOS 78dB SNDR 87mW 20MHz BW CT delta-sigma ADC with VCO-based integrator and quantizer," Solid-State Circuits Conference—Digest of Technical Papers, 2009. ISSCC 2009. IEEE International, vol., no., pp. 170-171,I71a, Feb. 8-12, 2009.

(Continued)

*Primary Examiner* — Jean Jeanglaude
(74) *Attorney, Agent, or Firm* — SpryIP, LLC

(57) ABSTRACT

An apparatus is provided which has a first analog input and a second analog input. In a particular implementation, the first analog input is coupled to a first controllable oscillator and the second analog input is coupled to a second controllable oscillator. First and second digital output signals generated based on output oscillations from the first controllable oscillator and the second controllable oscillator are combined.

24 Claims, 4 Drawing Sheets

OTHER PUBLICATIONS

Kim, J.; Jang, T.-K.; Yoon, Y.-G.; Cho, S.-H., "Analysis and Design of Voltage Controlled Oscillator-Based Analog-to-Digital Converter," Circuits and Systems I: Regular Papers, IEEE Transactions on : Accepted for future publication vol. PP, Forthcoming, 2009 pp. 1-1.

Henzler, S.; Koeppe, S.; Kamp, W.; Mulatz, H.; Schruitt-Landsiedel, D., "90nm 4.7ps-Resolution 0.7-LSB Single-Shot Precision and 19pJ-per-Shot Local Passive Interpolation Time-to-Digital Converter with On-Chip Characterization," Solid-State Circuits Conference, 2008. ISSCC 2008. Digest of Technical Papers. IEEE International, vol., no., pp. 548-635, Feb. 3-7, 2008.

Henzler, S.; Koeppe, S.; Lorenz, D.; Kamp, W.; Kuenemund, R.; Schmitt-Landsiedel, D., "A Local Passive Time Interpolation Concept for Variation-Tolerant High-Resolution Time-to-Digital Conversion", IEEE Journal of Solid-State Circuits, vol. 43, No. 7, pp. 1666-1676, Jul. 2008.

Ahmed, 1.; Mulder, J.; Johns, D.A., "A 50MS/s 9.9m W pipelined ADC with 58dB SNDR in 0.1 8micro-m CMOS using capacitive charge-pumps," Solid-State Circuits Conference—Digest of Technical Papers, 2009. ISSCC 2009. IEEE International, vol., no., pp. 164-165,165a, Feb. 8-12, 2009.

Brooks, L.; Hae-Seung Lee, "A 12b 50MS/s fully differential zero-crossing-based ADC without CMFB," Solid-State Circuits Conference—Digest of Technical Papers, 2009. ISSCC 2009. IEEE International, vol., no., pp. 166-167,167a, S-12 Feb. 2009.

* cited by examiner

ANALOG-TO-DIGITAL CONVERTER USING OSCILLATORS

FIELD OF THE INVENTION

The present invention relates to analog-to-digital converters (ADCs) using oscillators.

BACKGROUND

Some types of analog-to-digital converters convert analog signals to digital signals using a voltage controlled oscillator. In such converters, generally an analog input voltage signal is fed to the VCO, and the digital output value is determined based on the output of the VCO, which may for example involve a counting of pulses output by the VCO.

The resolution of such analog-to-digital converters is limited by non-linearities of the VCO. To improve the resolution, analog feedback or digital calibration are sometimes used. Analog feedback uses a large silicon area and increases the power consumption. The reduction of the non-linearity by digital calibration may be not sufficient for some applications.

DETAILED DESCRIPTION OF THE INVENTION

Figure 1:
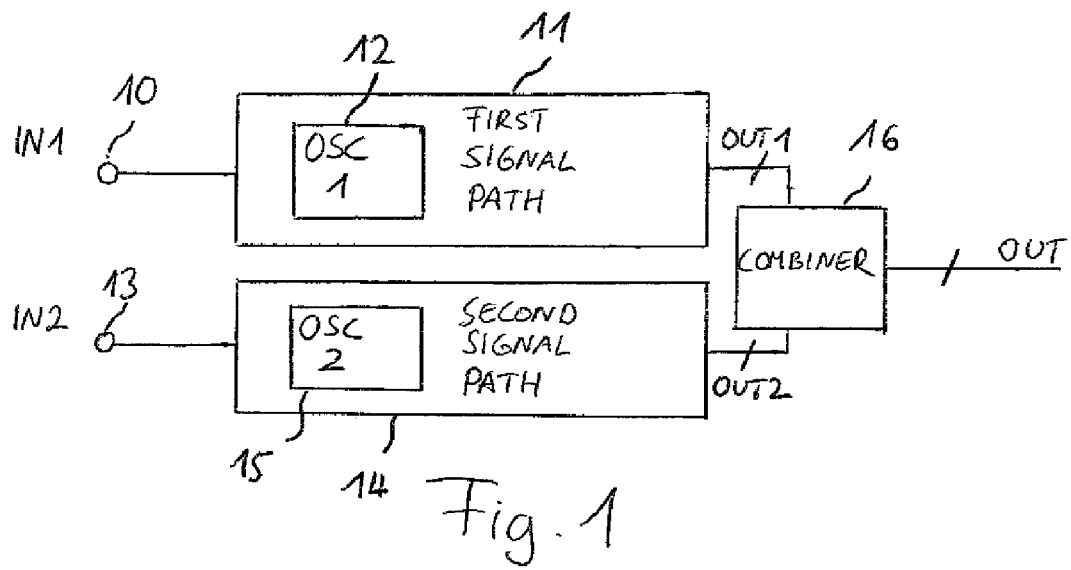
FIG. 1 shows a block diagram of an apparatus according to an embodiment.

In the following, some embodiments of the present invention will be described in detail. It is to be understood that the following description is given only for the purpose of illustration and is not to be taken in a limiting sense. The scope of the invention is not intended to be limited by the embodiments described hereinafter with reference to the accompanying drawings, but is intended to be limited only by the appended claims and equivalents thereof.

It is also to be understood that in the following description of embodiments any direct connection or coupling between functional blocks, devices, components, circuit elements or other physical or functional units shown in the drawings or described herein could also be implemented by an indirect connection or coupling, i.e. a connection or coupling comprising one or more intervening elements. Furthermore, it should be appreciated that functional blocks or units shown in the drawings may be implemented as separate circuits in some embodiments, but may also be fully or partially implemented in a common circuit in other embodiments. In other words, the description of various functional blocks is intended to give a clear understanding of various functions performed in a device or system shown and is not to be construed as indicating that these functional blocks have to be implemented as separate physical units. For example, one or more functional units may be implemented by programming a processor like a single digital signal processor accordingly.

It is further to be understood that any connection which is described as being wire-based in the following specification may also be implemented as a wireless connection and vice versa unless noted to the contrary.

It should be noted that the drawings are provided to give an illustration of some aspects of the embodiments of the present invention and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative location of the various components and implementations according to embodiments of the invention.

The features of the various embodiments described herein may be combined with each other unless specifically noted otherwise. On the other hand, describing an embodiment with a plurality of features is not to be construed as indicating that all those features are necessary for practicing the present invention, as other embodiments may comprise less features and/or alternative features.

In the following, various embodiments of analog-to-digital converters (ADCs) will be described. Analog-to-digital converters generally are devices which convert one or more analog input signals, for example voltage signals or current signals, to one or more digital output signals.

Some embodiments described in the following comprise controllable oscillators. Controllable oscillators generally are oscillators which output one or more oscillating signals, also referred to as oscillations, the one or more signals having a frequency which is dependent on a control signal supplied to the controllable oscillator. One common class of controllable oscillators are voltage controlled oscillators (VCOs). It should be noted that such a voltage controllable oscillator may e.g. be converted to a current controlled oscillator by adding a current-to-voltage converter.

Turning now to the Figures, in FIG. 1 an analog-to-digital converter according to an embodiment is shown.

The apparatus shown in FIG. 1 comprises a first analog input 10 for receiving a first analog input signal IN1 and a second analog input 13 to receive a second analog input signal IN2. Signals IN1, IN2 may for example be voltage signals or current signals. In an embodiment, IN1 and IN2 are two part signals of a differential signal. In some embodiments, IN2 is the negative of IN1.

First analog input 10 is coupled to a first signal path 11, first signal path 11 comprising a first controllable oscillator 12. Controllable oscillator 12 is configured to generate one or more output signals the frequency of which depends on first analog input signal IN1. First signal path 11 is further configured to generate a first digital output signal OUT1 based on the output signals of first controllable oscillator 12.

Second analog input 13 is coupled to a second signal path 14 comprising a second controllable oscillator 15. Second controllable oscillator 15 is configured to output one or more output signals the frequency of which depends on second analog input signal IN2. Second signal path 14 is further configured to generate a second digital output signal OUT2 based on the signal(s) output from second controllable oscillator 15.

The apparatus of FIG. 1 further comprises a combiner 16 which combines first digital output signal 1 and second digital output signal 2, for example by subtraction or addition, and generates a further digital output signal OUT which constitutes the output signal of the analog-to-digital converter.

It is to be noted that the description of the above embodiments with two signal paths and two analog input signals is not to be construed as limiting, and other embodiments may comprise additional analog signal inputs and/or additional signal paths.

Figure 2:
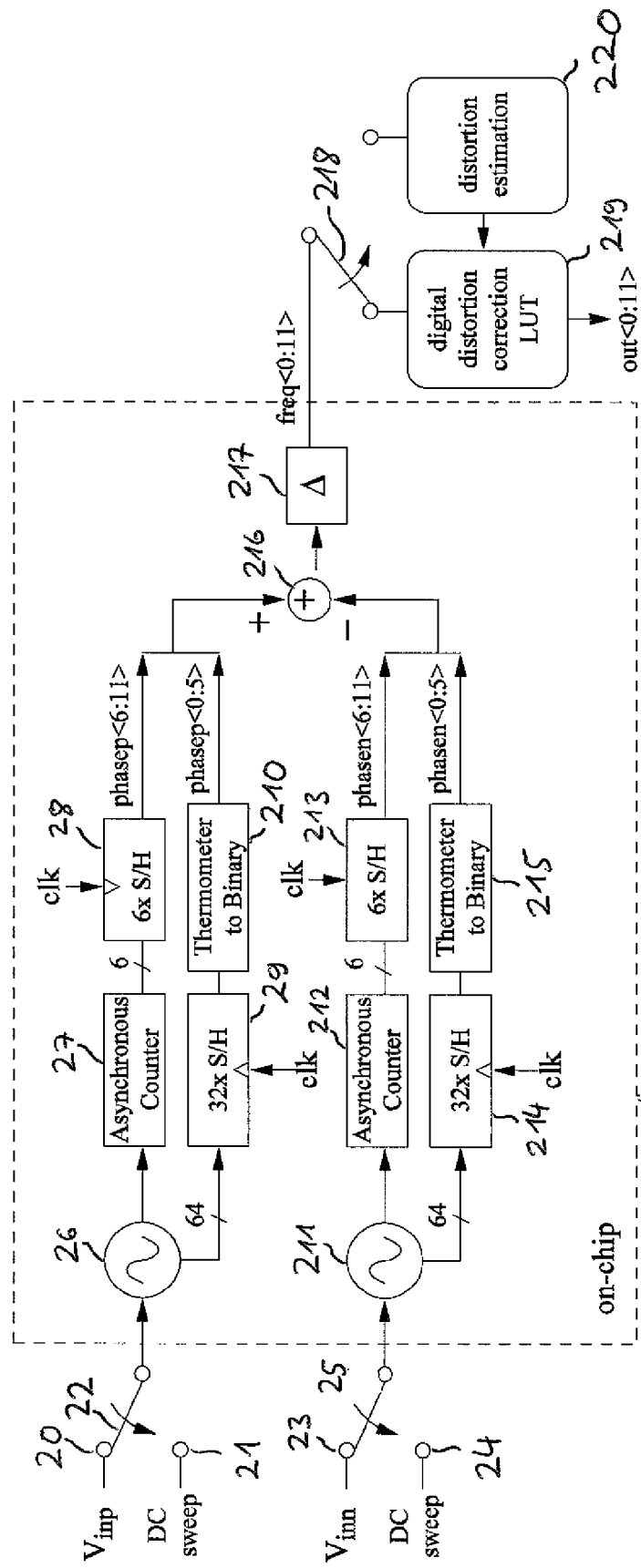
FIG. 2 shows a block diagram of an apparatus according to another embodiment.

In FIG. 2, an analog-to-digital converter according to a further embodiment of the invention is shown.

The apparatus shown in FIG. 2 comprises a first analog signal input 20 and a second analog signal input 23 to receive a positive part signal $V_{inp}$ and a negative part signal $V_{inn}$, respectively, of a differential input voltage signal. Furthermore, the apparatus of FIG. 2 comprises a first calibration input 21 and a second calibration input 24. A switch 22 is provided to switch between first analog input 20 and first calibration input 21, and a switch 25 is provided to switch between second analog signal input 23 and second calibration input 24.

Switch 22 is further coupled to an input of a first voltage-controlled oscillator (VCO) 26. In the embodiment of FIG. 2, first voltage-controlled oscillator 26 is configured to output 64 output signals having different phases, but the same frequency, the frequency being determined by the signal supplied via first switch 22.

In the embodiment of FIG. 2, one of the signals output by first VCO 26 is fed to a first path comprising a first asynchronous counter 27 which counts the periods of the signal received from first VCO 26. For example, first asynchronous counter 27 may count rising edges or falling edges of the signal received from first VCO 26. In other words, asynchronous counter 27 counts a number of full periods of the output signal. In the embodiment of FIG. 2, asynchronous counter 27 is a 6-bit counter outputting a 6-bit digital signal. This 6-bit digital signal is fed to a first 6-fold sample and hold unit 28 of the first path (one sample and hold circuit for each bit) clocked by a clock signal clk. The output of the first 6-fold sample and hold unit 28 represents upper 6 bits, numbered 6 to 11 in the embodiment of FIG. 2, of a first digital output signal phasep.

All 64 output signals of first VCO 26 are fed to a second path comprising a first 32-fold sample and hold unit 29, wherein two output signals are fed to each sample and hold circuit of 32-fold sample and hold unit 29, which is also clocked by clock signal clk. First 32-fold sample and hold unit 29 outputs a 32-bit output signal to a first thermometer to binary encoder 210 of the second path, which converts the 32-bit signal to a 6-bit value representing lower 6 bits, i.e. bits numbers 0 to 5, of first digital output signal phasep.

In this way, first 32-fold sample and hold unit 29 and first thermometer to binary encoder 28 basically determine a value corresponding to a fractional portion of a period of the output signals of VCO 26.

First VCO 26, first asynchronous counter 27, first 6-fold sample and hold unit 28, first 32-fold sample and hold unit 29 and first thermometer to binary encoder 210 form a first signal path comprising the above-explained first and second paths. A second signal path operating in the same manner on a signal received via second switch 25 is formed by a second VCO 211, a second asynchronous counter 212, a second 6-fold sample and hold unit 213, a second 32-fold sample and hold unit 214 and a second thermometer to binary encoder 215, which generates a second digital output signal phasen. The operation of the second signal path corresponds to the operation of the first signal path described above and will therefore not be described again.

First digital output signal phasep is fed to a positive input of a subtractor 216, and second digital output signal phasen is fed to a negative input of subtractor 216, which subtractor 216 generates as an output a 12-bit signal the difference phasep-phasen. This difference signal is fed to a first order differentiator 217 which outputs a 12-bit output signal freq in FIG. 2.

Signal freq via a switch 218 is fed to a digital distortion correction 219 using a lookup-table which digital distortion correction 219 may for example correct for non-linearities of first VCO 26 and second VCO 211. For calibration, switch 218 may be switched to feed signal freq to a distortion estimation unit 220.

Digital distortion correction unit 219 then outputs a 12-bit output signal out which is a digital representation of the analog differential input signal $V_{inp}$, $V_{inn}$.

It should be noted that any numbers given in the embodiment of FIG. 2 are merely given us an illustration. FIG. 2 represents a 12-bit analog-to-digital converter, but other bit widths are equally possible by adjusting e.g. the number of output signals of first VCO 26 and second VCO 211 and the number of sample and hold circuits in units 28, 29, 213 and 214 accordingly.

In the following, examples for implementations of some elements of some embodiments will be described with reference to FIGS. 3 to 5. It should be noted that the elements of FIGS. 1 and 2 are not restricted to the ones described in the following, but the following additional description serves merely illustrative purposes.

In some embodiments, oscillators like first VCO 26, second VCO 211 oscillator 12 and/or oscillator 15 may be implemented as a ring oscillator using a chain of inverters. For example, as shown in FIG. 3 a ring of 16 differential inverters 31 with local interpolation may be used, each inverter outputting four of the output signals of first VCO 26 or second VCO 211. As a matter of course, for ADCs other than a 12-bit ADC, the number of inverters may vary, and in other embodiments instead of inverters with interpolation invertors without interpolation with a corresponding increased number of inverters or oscillators other than ring oscillators may be used.

Figure 3:
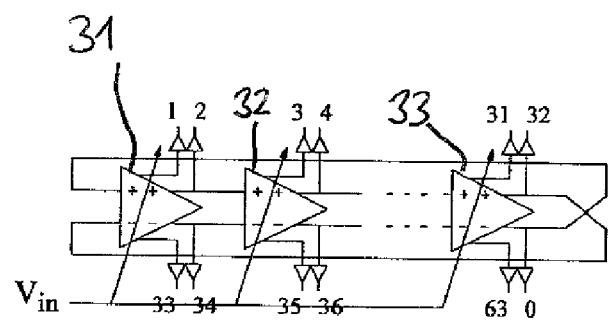
FIG. 3 shows a portion of an oscillator according to some embodiments.

In the embodiment of FIG. 3, inverter 31 outputs output signals number 1, 2, 33 and 34, signals number 33 and 34 being the inverse of signals number 1 and 2. Inverter 32 outputs signals number 3, 4, 35 and 36, signals number 35 and 36 being the inverse of signals number 3 and 4, up to inverter 33, which outputs output signals number 31, 32, 63 and 0, signals 63 and 0 being the inverse of signals 31 and 32, respectively. In FIG. 3, the signal $V_{in}$ is the respective analog input signal, e.g. $V_{inp}$ or $V_{inn}$ in the embodiment of FIG. 2.

Figure 4:
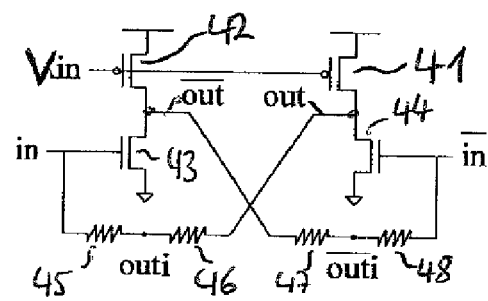
FIG. 4 shows an example implementation of an inverter of FIG. 3.

An example implementation of interpolating inverters 31, 32 and/or 33 is shown in FIG. 4.

In FIG. 4, an inverter is shown comprising PMOS transistors 41, 42 and NMOS transistors 43, 44. The voltage $V_{in}$ is fed to the gates of PMOS transistors 41 and 42. An input signal, which corresponds to an output signal of a previous inverter in the ring shown in FIG. 3, is fed to the gates of NMOS transistors 43 and 44, in for example corresponding to the signal output from the output marked with a "+" in FIG. 3 and $\overline{in}$ corresponds to the signal from the output marked with a "−" in FIG. 3. An output signal out and its inverted version $\overline{out}$ can be tapped at nodes between PMOS transistor 41 and NMOS transistor 44 for the signal out and between PMOS transistor 42 and NMOS transistor 43 for the signal $\overline{out}$.

Furthermore, using resistors 45, 46, 47 and 48, the input signals and the output signals are used to form interpolated signals outi, $\overline{outi}$ as shown in FIG. 4.

For illustration, assuming that the circuit of FIG. 4 represents inverter 32 of FIG. 3, the signal in would correspond to signal number 2, the signal $\overline{in}$ would correspond to signal number 34, the signal outi would correspond to signal number 3, the signal $\overline{outi}$ would correspond to signal 35, the signal out would correspond to signal number 4 and the signal $\overline{out}$ would correspond to signal number 36.

As mentioned, the arrangement of FIG. 4 is only one implementation of an inverter which is usable in a ring up implementation, and other implementations, in particular implementations without interpolation, are also possible as explained above.

Next, with respect to FIG. 5 an example implementation of a sample and hold circuit e.g. of 32-fold sample and hold unit 214 of FIG. 2 will be explained. The example implementation of a sample and hold circuit shown in FIG. 5 comprises PMOS transistors 51 to 54 and 510 to 513 and 516, NMOS transistors 55 to 58 and 514, 515, 517 to 519. 50 denotes a positive supply voltage, for example VDD, and 59 denotes a negative supply voltage, for example VSS or ground.

clk, as in FIG. 2, denotes a clock signal. The input signals to the sample and hold circuit of FIG. 5 are denoted D and $\overline{D}$, $\overline{D}$ being the inverse of D. For example, 32-fold sample and hold unit 214 of FIG. 2 may comprise 32 circuits as shown in FIG. 5, a first one of these circuits receiving output signals number 1 and 33 as shown in FIG. 3, a second one receiving output signals 2 and 34 as shown in FIG. 3 as D and $\overline{D}$, respectively, etc.

Figure 5:
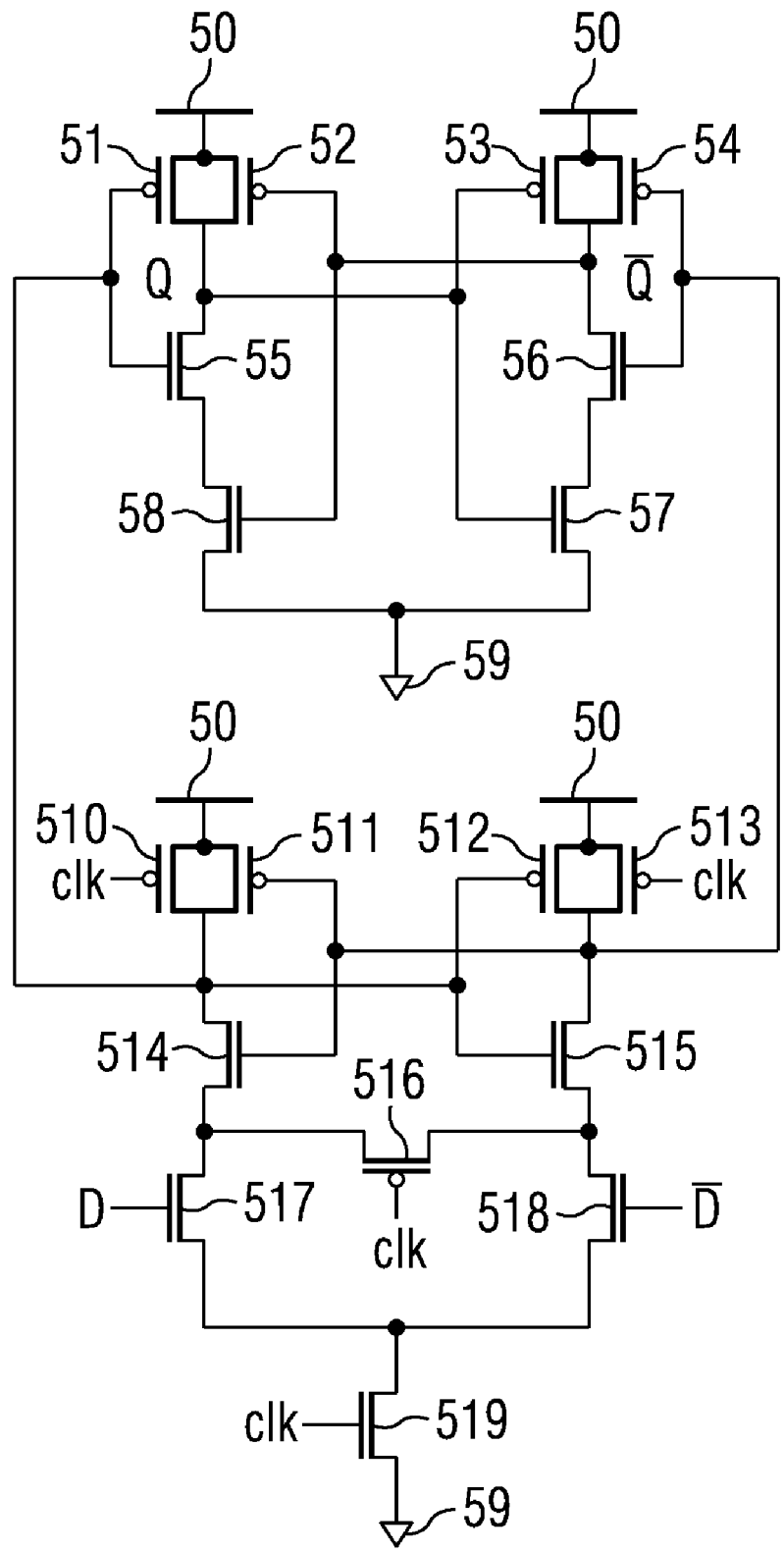
FIG. 5 shows an example for a sampling circuit of some embodiments.

The corresponding output signals are labeled Q and $\overline{Q}$ in FIG. 5.

Again, it is to be noted that the implementation shown in FIG. 5 serves merely as an example, and other sample and hold circuits known in the art may be used as well.

In a regular mode of operation of the embodiment of FIG. 2, as already mentioned switches 22, 25 and 218 are in the position shown in FIG. 2, and the analog input signal $V_{inp}$, $V_{inn}$ is converted to a digital output signal out. In a calibration mode, switch 22 couples input 21 with first oscillator 26, switch 25 couples input 24 with second oscillator 211, and switch 21 couples distortion estimated unit 220 with the output of differentiator 217. This calibration which may compensate some non-linearities will be explained in the following in some more detail using FIGS. 6 and 7 as examples.

In the calibration mode, via input 21 and 24 a "DC sweep" is performed, i.e. a series of predetermined DC voltages is input. The thus applied predetermined input values are converted to signal freq as explained above, and distortion estimation unit 220 compares the signal freq with a target value which target value corresponds to the predetermined analog input value at the corresponding time and, in case the value of freq deviates from the target value, stores a corresponding correction value in a lookup-table which later in the regular mode of operation is used by digital distortion correction unit 219 to correct the output signal. This is performed for a predetermined number of correction points.

Figure 6:
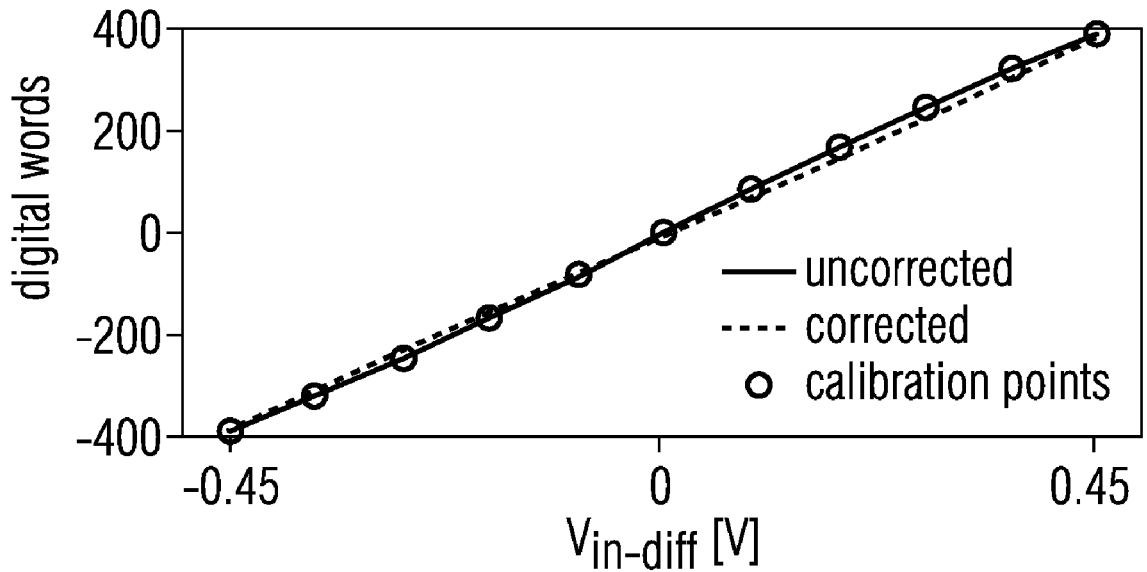
FIGS. 6 and 7 show graphs for illustrating the functioning of a distortion correction according to some embodiments.
Figure 7:
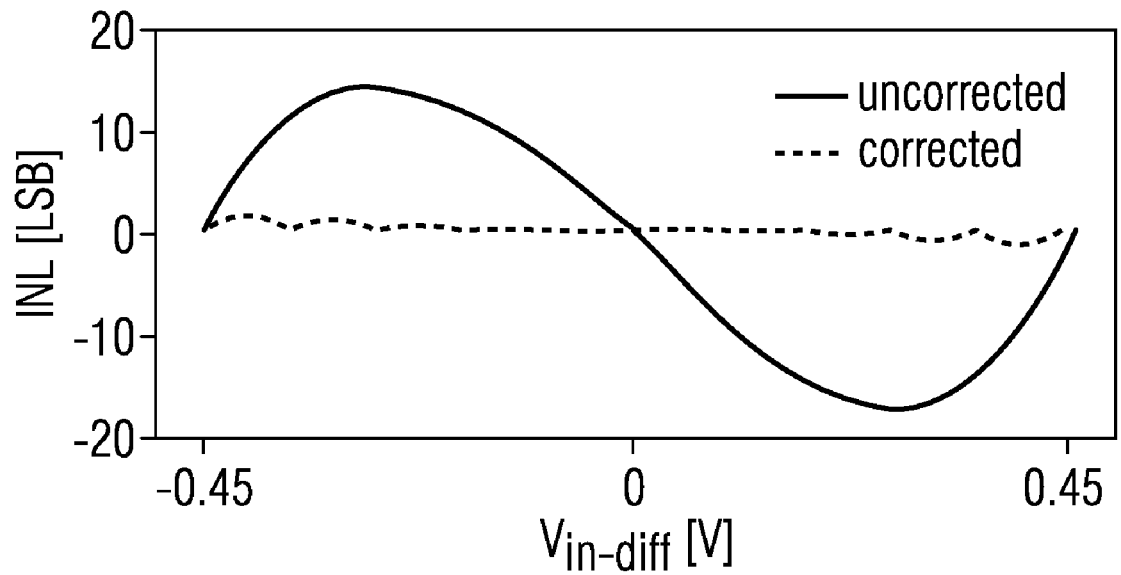

For example, in FIG. 6 a digital output value depending on the input signal, i.e. the difference of the input signals applied to inputs 21 and 24, for a specific implementation of an embodiment are shown. A solid line shows the result without correction, circles show the calibration points and a dashed line then shows the result with correction. Likewise, FIG. 7 shows the non-linearity for the implementation in units of the least significant bit (LSB, i.e. if the non-linearity is e.g. 10 LSB, this means that a digital code output deviates from the "correct" result by 10 LSB) with and without such a correction. As can be seen, using the correction the linearity is increased. However, as also can be seen from FIG. 6, the correction may also be omitted in some embodiments if the linearity without the correction is sufficient for a given application.

It is to be noted that the above-described embodiments serve only as examples and are not to be construed as limiting, as a plurality of variations and modifications are possible. Some of these modifications already have been discussed above, others will be explained in more detail below.

While in the embodiment of FIG. 2 separate inputs are provided for regular mode and for calibration, switches 22, 25 may also be omitted and the same inputs may be used for regular conversion or for calibration.

While in the embodiment of FIG. 2, voltage inputs have been used, in other embodiments current inputs together with or without current-to-voltage converters may also be used. As already mentioned, the bit width shown in FIG. 2 serves only as an example, and other bit widths for the converter are equally possible.

The number of calibration shown in FIG. 6 also serves only as an example, and any desired number of calibration points to obtain a desired accuracy of calibration may be used.

What is claimed is:

1. An apparatus, comprising:
a first analog input,
a second analog input,
a first signal path comprising a first controllable oscillator, the first signal path being coupled to said first analog input and the first controllable oscillator having a first plurality of outputs,
a second signal path comprising a second controllable oscillator, the second signal path being coupled to said second analog input and the second controllable oscillator having a second plurality of outputs, and
a combiner coupled to said first plurality of outputs and said second plurality of outputs,
wherein the combiner is configured to combine a first portion of said first plurality of outputs and a first portion of said second plurality of outputs to generate upper bits of an output of the apparatus, and
the combiner is configured to combine a second portion of said first plurality of outputs and a second portion of said second plurality of outputs to generate lower bits of the output of the apparatus.

2. The apparatus of claim 1, wherein said first signal path comprises a counter coupled to an output of said first controllable oscillator, and said second signal path comprises a counter coupled to an output of said second controllable oscillator.

3. The apparatus of claim 1, wherein said first controllable oscillator is to be controlled via said first analog input and said second controllable oscillator is to be controlled via said second analog input.

4. The apparatus of claim 1, further comprising a distortion correction coupled to an output of said combiner.

5. The apparatus of claim 4, wherein said distortion correction comprises a lookup-table.

6. The apparatus of claim 1, wherein at least one of said first controllable oscillator and said second controllable oscillator comprises a ring oscillator.

7. The apparatus of claim 6, wherein said ring oscillator comprises a plurality of inverters and interpolation circuitry.

8. The apparatus of claim 1, wherein said combiner comprises at least one of an adder and a subtractor.

9. The apparatus of claim 1, wherein said combiner comprises a differentiator.

10. An apparatus, comprising:
a first voltage input,
a first voltage-controlled oscillator coupled with said first voltage input,
a second voltage input,
a second voltage-controlled oscillator coupled with said second voltage input, and a subtractor, a positive input of said subtractor being coupled to at least one output of said first voltage-controlled oscillator and a negative input of said subtractor being coupled to at least one output of said second voltage-controlled oscillator, wherein said first voltage-controlled oscillator is configured to output a plurality of output signals having the same frequency, but different phases, via first outputs, a first path being coupled between one of said first outputs of said first voltage-controlled oscillator and said positive input, and a second path being coupled between said plurality of said first outputs of said first voltage-controlled oscillator and said positive input, wherein said second voltage-controlled oscillator is configured to output a plurality of output signals having the same frequency, but different phases, via second outputs a third path being coupled between one of said second outputs of said second voltage-controlled oscillator and said negative input, and a fourth path being coupled between a plurality of said second outputs of said second voltage-controlled oscillator and said negative input.

11. The apparatus of claim 10, wherein said first voltage input is coupled to said first voltage-controlled oscillator via a first switch when said first switch is in a first position, wherein a calibration input is coupled to said voltage-controlled oscillator when said first switch is in a second position, and wherein said second voltage input is coupled to said second oscillator via a second switch when said second switch is in a first position, wherein a second calibration input is coupled to said voltage-controlled oscillator when said second switch is in said second position.

12. The apparatus of claim 10, wherein said first path comprises a first counter, and wherein said third path comprises a second counter.

13. The apparatus of claim 12, wherein said first path comprises a first sample and hold unit downstream of said first counter, and wherein said third path comprises a second sample and hold circuit downstream of said second counter.

14. The apparatus of claim 10, wherein said first path is configured to generate upper bits of a first digital output signal, and said third path is configured to generate upper bits of a second digital output signal.

15. The apparatus of claim 10, wherein said second path comprises a first plurality of sample and hold circuits, and said fourth path comprises a second plurality of sample and hold circuits.

16. The apparatus of claim 15, wherein said second path comprises a first thermometer to binary encoder downstream of said first plurality of sample and hold circuits, and wherein said fourth path comprises a second thermometer to binary encoder downstream of said second plurality of sample and hold circuits.

17. The apparatus of claim 10, wherein said second path is configured to generate lower bits of a first digital output signal, and said fourth path is configured to generate lower bits of a second digital output signal.

18. The apparatus of claim 10, further comprising a differentiator coupled to an output of said subtractor.

19. The apparatus of claim 10, further comprising a digital distortion correction coupled to an output of said subtractor.

20. The apparatus of claim 19, wherein said digital distortion correction is coupled to said output of said subtractor via a switch when said switch is in a first position, said apparatus further comprising a distortion estimation, said distortion estimation being coupled to said output of said subtractor when said switch is in a second position.

21. A method, comprising:
providing a first analog input signal,
providing a second analog input signal,
concurrently generating, at first oscillator, a plurality of first oscillation signals having a common frequency with differing phases, the frequency of said at plurality of first oscillation signals being dependent on said first analog input signal,
concurrently generating, at a second oscillator, a plurality of second oscillation signals having a common frequency with differing phases, the frequency of said plurality of second oscillation signals being dependent on said second analog input signal,
generating a first digital output signal based on said plurality of first oscillation signals,
generating a second digital output signal based on said plurality of second oscillation signals, and
combining said first digital output signal and said second digital output signal.

22. The method of claim 21, further comprising differentiating a combination of said first digital output signal and said second digital output signal.

23. The method of claim 21, wherein generating said first digital output signal comprises counting a number of periods of at least one oscillation signal of said plurality of first oscillation signals, and generating said second digital output signal comprises counting a number of periods of at least one oscillation signal of said plurality of second oscillation signals.

24. The method of claim 23, wherein
said generating said first digital output signal comprises sampling said at least one oscillation signal of said plurality of first oscillation signals and said at least one oscillation signal of said plurality of second oscillation signals and performing a thermometer to binary encoding based of the sampled oscillation signals.

* * * * *